United States Patent
Iizuka

(12) 
(10) Patent No.: US 6,338,996 B1
(45) Date of Patent: Jan. 15, 2002

(54) SEMICONDUCTOR MEMORY DEVICE PRODUCTION METHOD

(75) Inventor: Toshihiro Iizuka, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/537,415

(22) Filed: Mar. 29, 2000

(30) Foreign Application Priority Data

Apr. 21, 1999 (JP) ............................................ 11-113206

(51) Int. Cl.$^7$ ................................................ H01L 21/31
(52) U.S. Cl. ..................... 438/240; 438/3; 438/142; 438/239; 427/126.3; 427/126.5
(58) Field of Search ............................ 438/3, 142, 239, 438/240; 427/126.3, 126.5

(56) References Cited

U.S. PATENT DOCUMENTS 6,187,693 B1 * 2/2001 Koyanagi .................. 438/785

FOREIGN PATENT DOCUMENTS

| JP | 7-50394 | 2/1995 |
| JP | 7-93969 | 4/1995 |
| JP | 10-189908 | 7/1998 |
| JP | 10-233485 | 9/1998 |

* cited by examiner

*Primary Examiner*—Charles Bowers
*Assistant Examiner*—Lisa Kilday
(74) *Attorney, Agent, or Firm*—Sughrue, Mion, Zinn, Macpeak & Seas, PLLC

(57) ABSTRACT

In a semiconductor memory device production method for a semiconductor memory device having a capacitor formed by a high dielectric insulation film and a noble metal upper electrode successively formed on a noble metal lower electrode, the formation of the capacitor is followed by anneal in a gas mixture atmosphere of oxygen concentration of 0 to 5% and nitrogen at temperature of 300 to 400 degrees C. This enables to reduce the leak current at room temperature and suppress leak current increase during a high temperature operation.

5 Claims, 6 Drawing Sheets

SEMICONDUCTOR MEMORY DEVICE PRODUCTION METHOD

BACKGROUND OF THE INVENTION

1. Field of the Invention

The present invention relates to a production method for producing a semiconductor memory device having a high dielectric thin film capacitor.

2. Description of the Related Art

As the semiconductor memory device integration becomes higher, the area where a capacitor can be formed becomes smaller. It has become difficult to obtain a desired area for the capacitor. To cope with this, there has been suggested to use a highly dielectric substance such as BST and PZT for a dielectric film, whereas a study has been made on a highly dielectric thin film capacity using a noble metal as the upper and lower electrodes.

Now, explanation will be given on an example of production method of the highly dielectric thin film capacitor. Firstly, a MOSFET is formed by a known method on a Si substrate, and an insulation film of $SiO_2$ is formed by the CVD method or the like. Then, a capacitance contact plug is formed from polysilicon on the aforementioned insulation film. After this, a barrier layer of Tin/Ti and a noble metal lower electrode of Ru or the like are formed and processed into a desired shape by RIE. Then, by using the electron cyclotron resonance (ECR)-MOCVD method, a thin film of $(Ba, Sr)TiO_3$ (BST) is formed at the substrate temperature of 200 degrees C. After this, in order to get rid of peeling of the lower electrode, the BST thin film is crystallized with the RTA processing at 700 degrees C. in nitrogen. Next, a noble metal upper electrode using Ru or the like is formed to obtain a thin film capacitor. Then, with a known procedure, surface treatment is performed including formation of a passivation film.

In the highly dielectric thin film capacitor thus obtained, the BST thin film is formed at a low temperature of 200 degrees C. before crystallized by the RTA processing. Accordingly, the crystallization of the boundary between the lower electrode and the BST thin film is not sufficient. Moreover, formation of the upper electrode causes a damage to the boundary between the lower electrode and the BST thin film and crystallization of this boundary is also insufficient.

Although the leak current at room temperature is preferably in the order of $10^{-8}$ $(A/cm^2)$ when $\pm 1V$ is applied, the leak current during a high temperature operation becomes as high as $10^{-7}$ $(A/cm^2)$ when $\pm 1V$ is applied. FIG. 6 shows the relationship between the voltage applied and the leak current density at the temperature of 25 degrees C. and 80 degrees C.

Accordingly, in a highly integrated semiconductor device using as a capacitor a BST film which is one of the highly dielectric films, the capacitor need to be annealed so as to assure a sufficient crystallization of the dielectric film and a stable leak current characteristic.

However, when anneal is performed in an atmosphere containing oxygen so as to obtain a sufficient crystallization of the dielectric film and stable leak current characteristic, if the anneal temperature is high, there arises a problem of conductivity defect and peeling-off at the contact portion under the lower electrode.

Consequently, it is preferable to perform anneal at a low temperature. Japanese Patent Publication 10-233485 discloses an invention in which oxygen or hydrogen plasma treatment is performed to eliminate dielectric film defects and impurities of a dielectric object surface and after this, post-anneal is performed at the temperature equal to or below 750 degrees C. Even if the plasma treatment is performed, the 750 degrees C. is not a low temperature and there arises a problem of peel-off and conductivity defect. Moreover, the plasma treatment increases the number of production steps.

Moreover, in order to lower the anneal temperature, Japanese Patent Publication 10-189908 discloses an invention in which the crystallized BST is formed by sputter of 550 degrees C. and a metal oxide film is formed before post-anneal is performed in an oxygen atmosphere of 2 to 10 atmospheric pressure, for example, at a temperature of 500 degrees C. However, even if the anneal is performed at 500 degrees C., there arise the problems of peel-off and conductivity defects.

SUMMARY OF THE INVENTION

It is therefore an object of the present invention to provide a semiconductor memory device production method in which a low temperature anneal is performed so as to reduce a leak current at room temperature and suppress leak current increase during an operation at a high temperature.

The present invention provides a semiconductor memory device production method for a semiconductor memory device having a capacitor formed by a high dielectric insulation film and a noble metal upper electrode which are successively layered on a noble metal lower electrode, the method being characterized in that the formation of the capacitor is followed by anneal in a nitrogen atmosphere of 1 atmospheric pressure at temperature of 300 to 400 degrees C.

According to another aspect of the present invention, there is provided a semiconductor memory device production method for a semiconductor memory device having a capacitor formed by a high dielectric insulation film and a noble metal upper electrode which are successively layered on a noble metal lower electrode, the method being characterized in that the formation of the capacitor is followed by anneal in a gas mixture atmosphere of oxygen concentration of 5% or below and nitrogen under 1 atmospheric pressure at temperature of 300 to 400 degrees C.

DESCRIPTION OF THE PREFERRED EMBODIMENTS

Description will now be directed to embodiments of the present invention with reference to the attached drawings.

Figure 1:
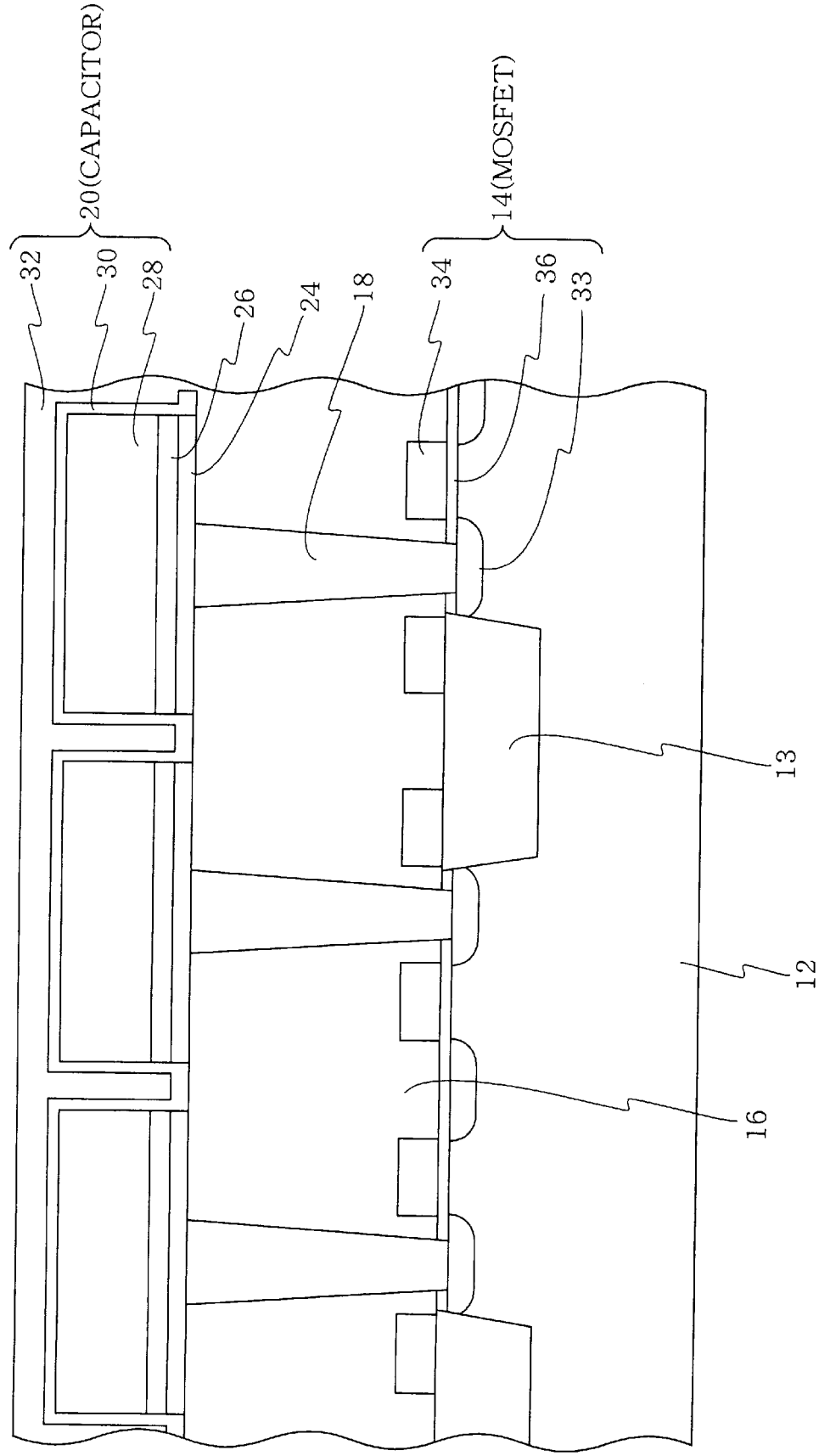
FIG. 1 is a cross sectional view of a semiconductor memory device according to the present invention.

FIG. 1 is a cross sectional view of a semiconductor memory device according to the present invention. The semiconductor memory device according to the present invention uses a (Ba, Sr)TiO$_3$ (BST) film as a capacity insulation film, and a noble metal such as Ru for the capacity upper electrode and the lower electrode, and includes: P type silicon substrate 12; MOSFET 14 provided on the silicon substrate 12 in an area isolated from the other MSOFETs by an element isolation insulation film 13; an inter-layer insulation film 16 such as SiO$_2$ for covering the MOSFET 14; a capacity contact 18 formed in a connection hole through the inter-layer film 16; and a capacitor 20 provided on the capacity contact 18 via a silicon contact layer 24 and a silicon diffusion resistant conductive layer 26.

The MOSFET 14 includes a gate electrode 34 formed on a gate oxide film 36, and a source/drain region made from an n-type diffused layer 33 formed at the both sides of the gate electrode 34 in the silicon substrate 12.

The capacitance contact 18 is formed from polysilicon.

The silicon contact layer 24 is provided to reduce a contact electric resistance between the polycilicon forming the capacitance contact 18 and the silicon diffusion resistant conductive layer 26. The silicon contact layer 24 is formed from, for example, a TiSi$_2$ film.

The silicon diffusion resistant conductive layer 26 is provided to prevent generation of a metal silicide by the metal constituting the lower electrode and the polysilicon of the capacitance contact 18, and is made from a high melting point metal such as a TiN layer and a WN layer or their nitride.

The capacitor 20 includes a lower electrode 28, a capacitance insulation film 30 formed by a dielectric film formed on the lower electrode 28, and an upper electrode 32. The lower electrode 28 and the upper electrode 32 are formed by a noble metal film such as Ru, Ir, and Pt.

The capacitance insulation film 30 is formed by a high dielectric film such as a (Ba, Sr)TiO$_3$ film (BST)

The capacitor 20 is connected to the n-type diffused layer 33 of MOSFET 14 via the capacitance contact 18.

Hereinafter, explanation will be given on a semiconductor memory device production method using a high dielectric thin film capacitor according to a first embodiment of the present invention with reference to FIG. 2 and FIG. 3. FIG. 2 and FIG. 3 are cross sectional views showing semiconductor memory apparatus production steps according to the present invention.

Firstly, according to a known method, a MOSFET (not depicted) is prepared by forming a gate oxide film, a gate electrode, and n-type diffused layer at both sides of the gate electrode in an area isolated by an element separation insulation film. Furthermore, by a known method, SiO$_2$ inter-layer film 16 having a film thickness of 300 nm is formed using the CVD method or the like. Next, a connection hole 17 is formed through the interlayer insulation film 16.

Figure 2A:
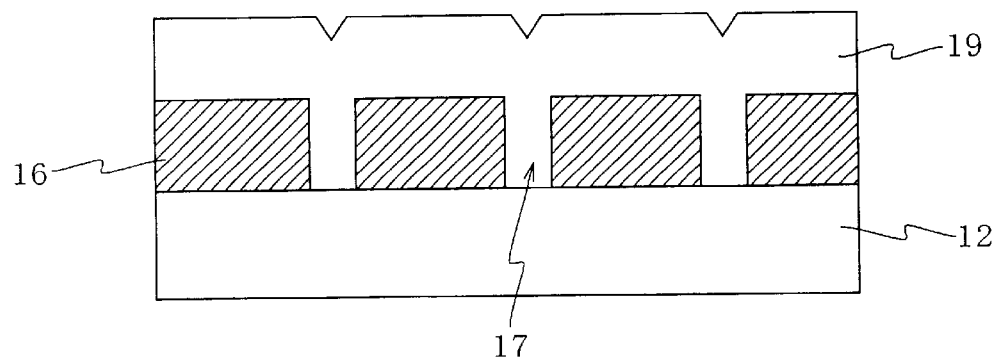
FIGS. 2(a) to (d) is a schematic cross sectional view showing a semiconductor memory device production method according to the present invention.

Subsequently, as shown in FIG. 2(a), a polylsilicon layer 19 is layered on the inter-layer insulation film 16 using the CVD method and phosphorus (P) using ion implantation method to lower the resistance of the polysilicon layer 19.

Figure 2B:
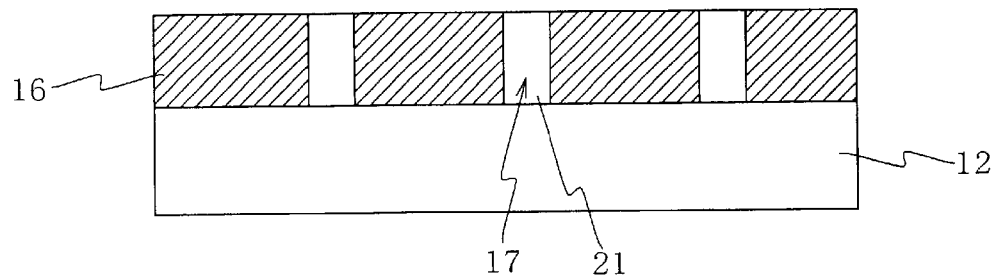

Next, as shown in FIG. 2(b), the polysilicon layer 19 is etched back so as to expose the inter-layer insulation film 16 and form a polysilicon plug 21 in the connection hole 17.

Figure 2C:
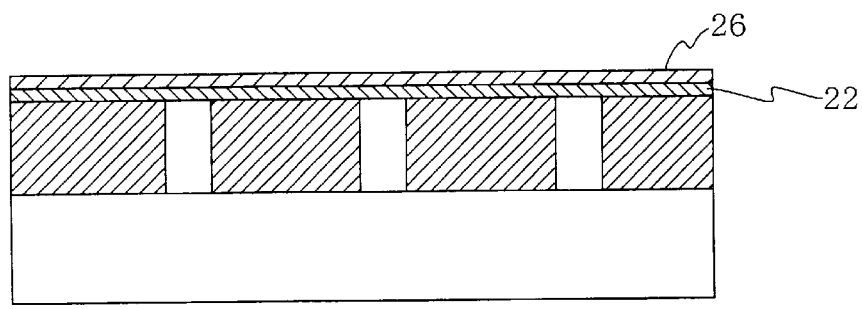

Next, as shown in FIG. 2(c), the sputter method or the like is used to form a silicon diffusion resistant conductive layer 26 including a Ti layer 22 having a film thickness of 30 nm and a TiN layer having a film thickness of 50 nm on the inter-layer insulation film 16 and the polysilicon plug 21.

Figure 2D:
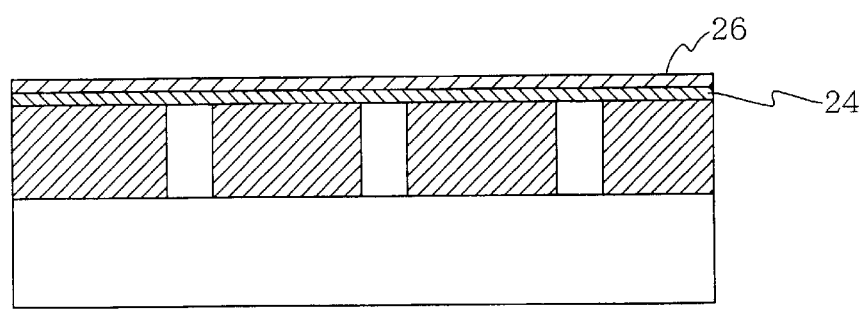

Next, RTA treatment is performed in a nitrogen atmosphere to change the Ti layer 22 into a TiSi layer so as to form a silicon contact layer 24 of the TiSi layer as shown in FIG. 2(d) on the insulation film layer 16 and the polysilicon plug 21.

Figure 3E:
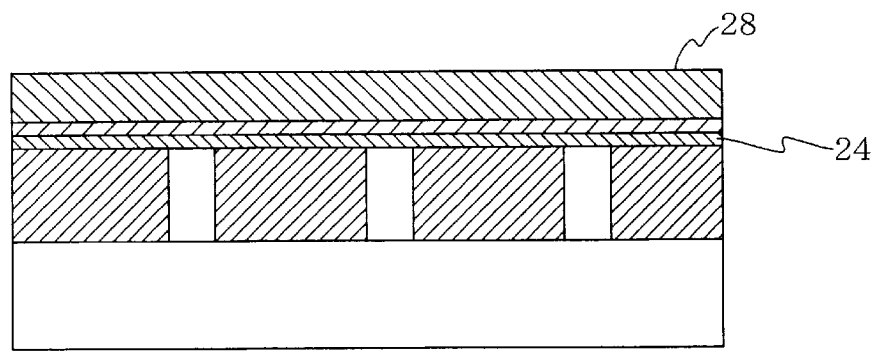
FIGS. 3(e) to (h) is a schematic cross sectional view showing a semiconductor memory device production method according to the present invention.

Next, as shown in FIG. 3(e), the CVD sputter or the like is used to form a 100 nm lower electrode layer 28 from Ru or the like on the silicon diffusion resistant conductive layer 26.

Figure 3F:
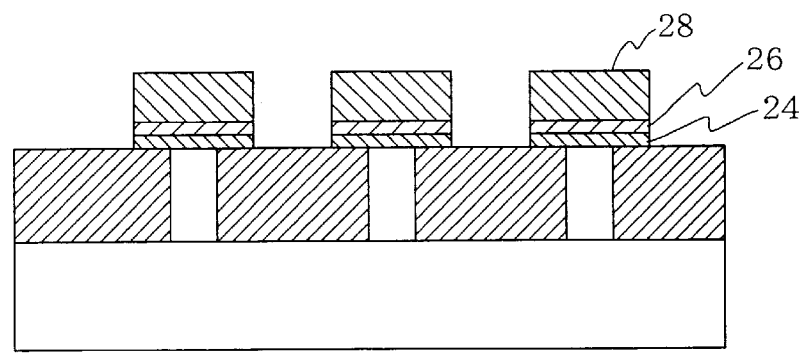

Next, the plasma etching is performed using a gas mixture of oxygen and chlorine, as shown in FIG. 3(f), to process the lower electrode 28, the silicon diffusion resistant conductive layer 26, and the silicon contact layer 24 into desired shapes.

Figure 3G:
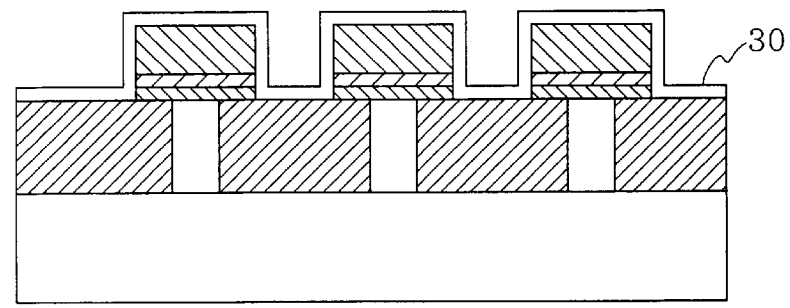

Next, as shown in FIG. 3(g), a 20 nm BST film is formed as a capacitance insulation film 30 by the ECR-CVD method using Ba(DPM)$_2$, Sr(DOM)$_2$, Ti(i-OC$_3$H$_7$)$_4$, and oxygen gas as raw materials.

Figure 3H:
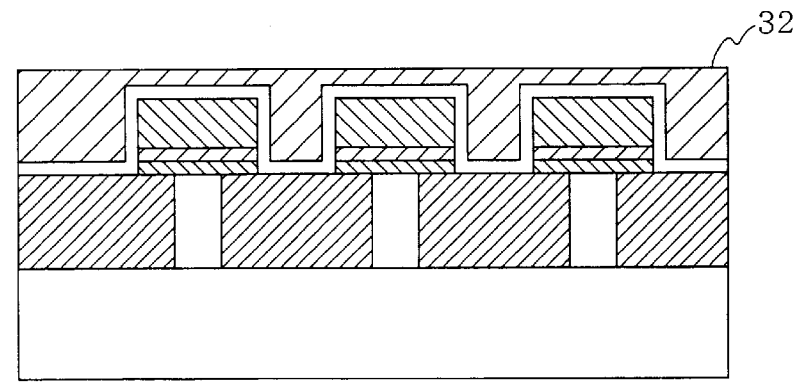

Next, as shown in FIG. 3(h), 100 nm upper electrode layer 32 is formed on the BST film, from Ru or the like by the DC sputter method, thus preparing a high dielectric thin film capacitor.

After forming the high dielectric thin film capacitor, anneal is performed for about 40 minutes under a normal pressure in a nitrogen atmosphere at temperature of 300 to 400 degrees C.

Thus, the semiconductor memory device according to the present invention is ready.

Figure 4:
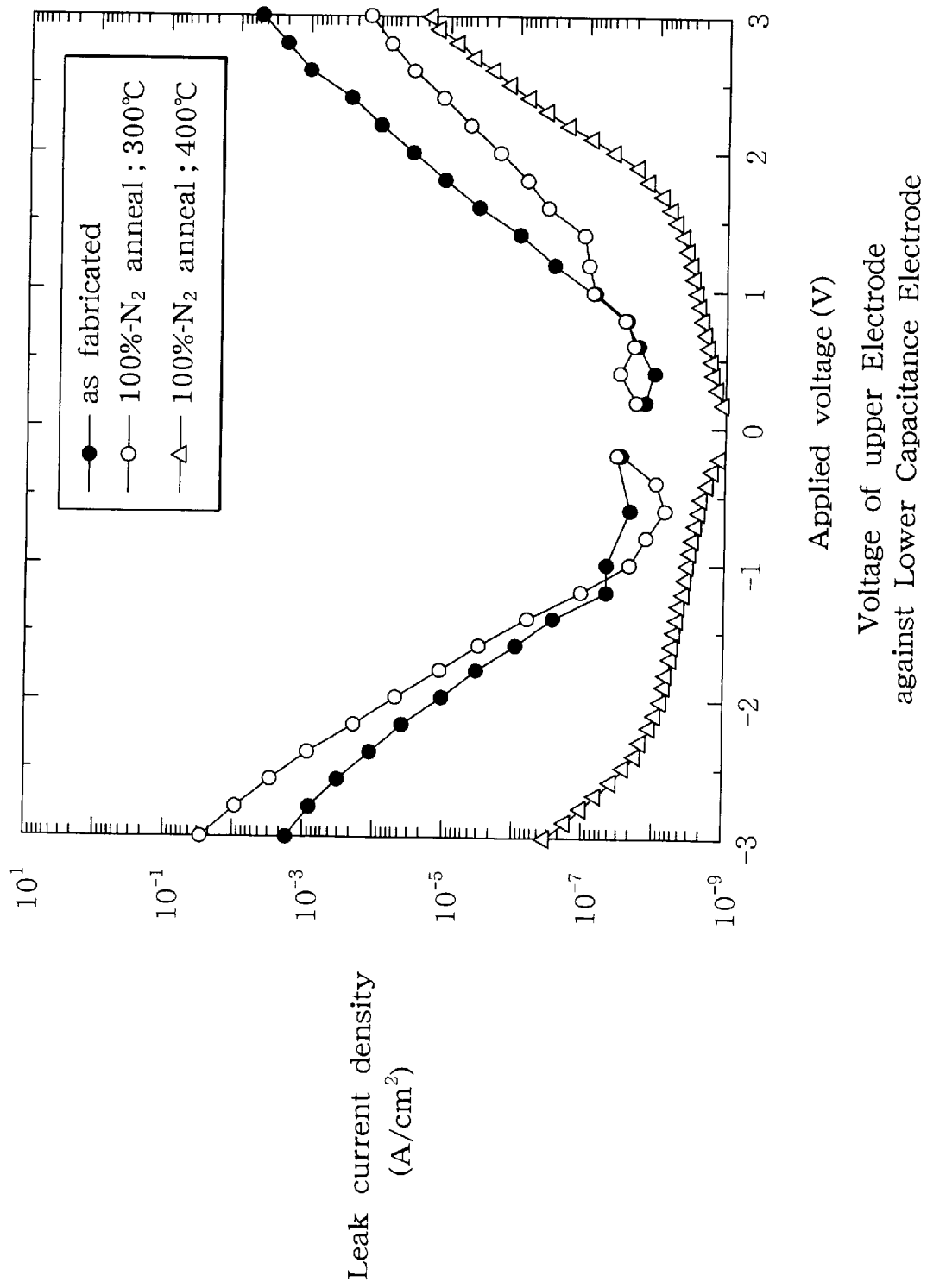
FIG. 4 is a graph showing the relationship between a voltage applied and a leak current density at room temperature in the semiconductor memory device according to the present invention.

FIG. 4 shows the relationship between the voltage applied (voltage of the upper electrode to the lower capacitance electrode) and the leak current density at room temperature in the semiconductor memory device using the high dielectric thin film capacitor thus obtained according to the present invention. As is clear from FIG. 4, the leak current is significantly reduced when anneal has been performed under a normal pressure in a nitrogen atmosphere at the range of 400 degrees C.

Figure 5:
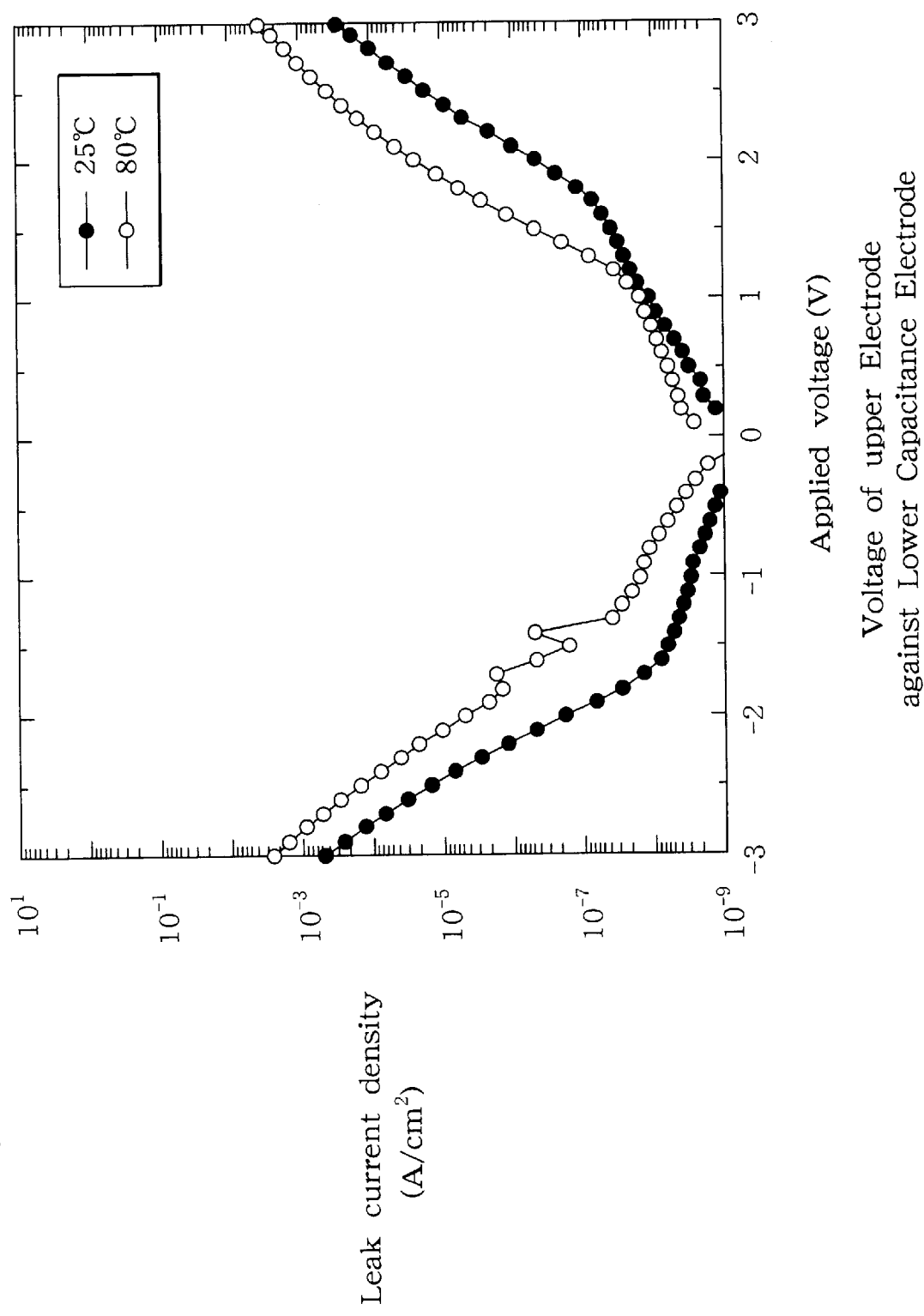
FIG. 5 is a graph showing the relationship between a voltage applied and a leak current density in the semiconductor memory device according to the present invention at temperature of 25 degrees C. and 80 degrees C.
Figure 6:
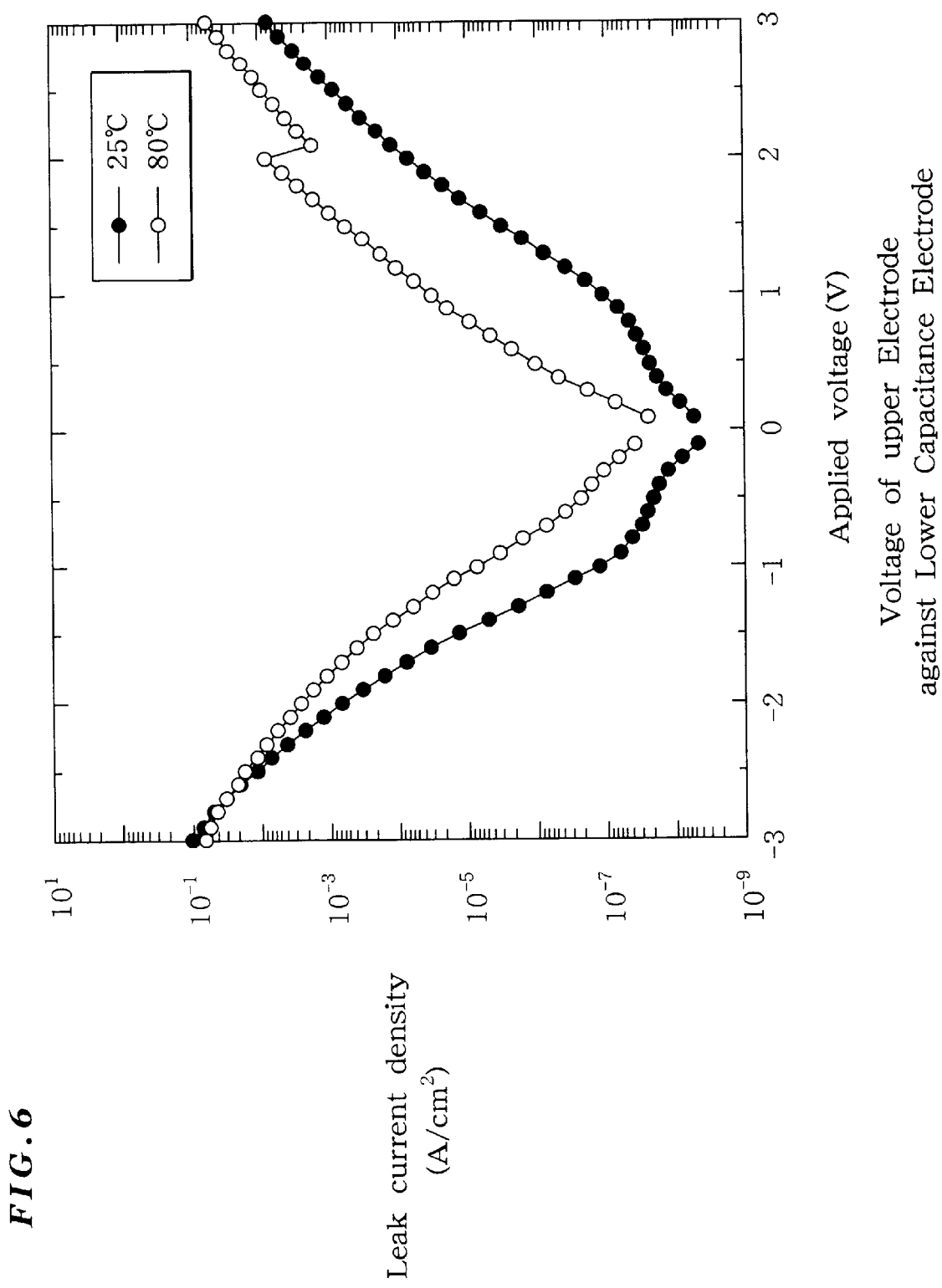
FIG. 6 is a graph showing the relationship between a voltage applied and a leak current density in a conventional semiconductor memory device at temperature of 25 degrees C. and 80 degrees C.

Moreover, FIG. 5 shows the relationship between the voltage applied and the leak current density at temperature of 25 degrees C. and 80 degrees C. According to FIG. 5, even at temperature of 80 degrees C, ±1V voltage applied assures 10$^{-8}$ (A/cm$^2$). That is, it can be seen that the leak current increase at a high temperature operation is suppressed.

Description will now be directed to a semiconductor memory device production method according to a second embodiment of the present invention. The method according to the second embodiment is identical to the method of the first embodiment up to the formation of the high dielectric thin film capacitor. In the second embodiment, after the high dielectric thin film capacitor is formed, anneal is performed in a gas mixture of oxygen (5% or below) and nitrogen at temperature of 300 to 400 degrees C. for about 40 minutes.

Addition of oxygen to nitrogen can eliminate oxygen deficiency immediately after the BST film formation. In addition to the preferable crystallization by nitrogen anneal, oxygen deficiency can be compensated by oxygen, which suppresses the leak current.

Almost identical leak results were obtained with the oxygen concentration of 0 to 5%. No effect was obtained at 200 degrees C.

When anneal is performed in a gas mixture atmosphere of oxygen concentration above 5% (10%, 20%, 50%, 100%) and nitrogen in the temperature range of 300 to 400 degrees C., if TiN is used for the silicon diffusion resistant conductive layer, TiN reacts with oxygen and nitrogen is removed, causing peel off.

$$TiN + O_2 \rightarrow TiO_2 + 1/2 N_2 \uparrow$$

Moreover, TiO$_2$ is an insulating material, damaging conductivity to disable function as a circuit.

It should be noted that Japanese Patent Publication 10-189908 discloses a method in which crystallized BST is formed by sputtering at 550 degrees C. and a metal oxide film is formed before performing post-anneal in an oxygen atmosphere of 2 to 10 atmospheric pressure higher than 1 atmospheric pressure, at the temperature of, for example, 500 degrees C. However, anneal in a 100% oxygen atmosphere at the temperature of 500 degrees C. causes peel off regardless of the pressure and there arises a problem of non-conductivity.

Moreover, as has been described above, in the second embodiment, after the upper electrode is formed, anneal is performed in a mixture atmosphere of oxygen concentration of 0 to 5% and nitrogen. This is because, when sputtering is used for formation of Ru on the BST thin film, defects may be involved on the boundary between the BST and Ru, and this can be recovered by annealing after formation of the upper electrode. That is, if the upper electrode is formed by CVD, no defect is caused in the BST thin film and it is possible to perform anneal, after formation of the BST thin film, in a mixture atmosphere of oxygen concentration of 0 to 5% and nitrogen.

Moreover, in the explanation of the first and the second embodiment, an example of (Ba, Sr)TiO$_3$ is used as the capacitance insulation film. However, it is also possible to use a Pb(Zr, Ti)O$_3$ film in this invention.

Moreover, in the explanation of the aforementioned embodiments, the upper and the lower electrode is formed from Ru, for example. However, it is also possible to use a noble metal such as Pt or Ir for the upper and the lower electrode so as to obtain the same effects.

Moreover, in the explanation of the aforementioned embodiments, the capacitor is a box type stack capacitor in which the lower electrode is processed into a parallelopiped. However, the present invention is not to be limited to that capacitor configuration if the high dielectric capacitance insulation film is sandwiched by the upper and the lower electrode.

As has been described above, according to the present invention, after formation of the capacitor, anneal is performed in a gas mixture atmosphere of oxygen concentration 0 to 5% and nitrogen at the temperature of 300 to 400 degrees C., which causes rearrangement of the boundary between the electrode and the BST thin film to improve the crystallization of the boundary between the electrode and the BST thin film. This reduces the leak current at room temperature and suppresses the leak current increase during high temperature operation. Even at 80 degrees C., it is possible to assure the order of $10^{-8}$ (A/cm$^2$) with the ±1V voltage applied.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 11-113206 (Filed on Apr. 21$^{st}$, 1999) including specification, claims, drawings and summary are incorporated herein by reference in its entirety.

What is claimed is:

1. A semiconductor memory device production method for a semiconductor memory device having a capacitor formed by a high dielectric insulation film and a noble metal upper electrode which are successively layered on a noble metal lower electrode, the method being characterized in that the formation of the capacitor is followed by anneal in a gas mixture atmosphere of oxygen concentration of 5% or below and nitrogen under 1 atmospheric pressure at temperature of 300 to 400 degrees C.

2. A semiconductor memory device production method as claimed in claim 1, wherein if the noble metal upper electrode is formed by the CVD method, the anneal is performed after formation of the high dielectric insulation film.

3. A semiconductor memory device production method as claimed in claim 1, wherein the high dielectric insulation film is a (Ba, Sr)TiO$_3$ film or Pb(Zr, Ti)O$_3$ film.

4. A semiconductor memory device production method as claimed in claim 1, wherein the noble metal is Ru, Ir, or Pt.

5. A semiconductor memory device production method as claimed in claim 1, wherein the capacitor is formed by: a step of processing the noble metal lower electrode into a desired shape by RIE treatment; a step of forming a high dielectric insulation film at the substrate temperature of 200 degrees C. by using the CVD method; a step of crystallizing the high dielectric insulation film by the RTA treatment of 700 degrees C. in nitrogen; and a step of forming the noble metal upper electrode.

* * * * *